United States Patent
Li et al.

(10) Patent No.: US 10,579,852 B2
(45) Date of Patent: Mar. 3, 2020

(54) FINGERPRINT IDENTIFICATION DEVICE AND MANUFACTURING METHOD THEREOF, ARRAY SUBSTRATE AND DISPLAY APPARATUS

(71) Applicants: BOE Technology Group Co., Ltd., Beijing (CN); Beijing BOE Optoelectronics Technology Co., Ltd., Beijing (CN)

(72) Inventors: Changfeng Li, Beijing (CN); Xue Dong, Beijing (CN); Xiaochuan Chen, Beijing (CN); Haisheng Wang, Beijing (CN); Yingming Liu, Beijing (CN); Shengji Yang, Beijing (CN); Xiaoliang Ding, Beijing (CN); Weijie Zhao, Beijing (CN); Wei Liu, Beijing (CN); Pengpeng Wang, Beijing (CN); Lei Wang, Beijing (CN); Pengcheng Lu, Beijing (CN); Jun Long, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 0 days.

(21) Appl. No.: 15/514,324

(22) PCT Filed: Sep. 1, 2016

(86) PCT No.: PCT/CN2016/097811
§ 371 (c)(1),
(2) Date: Mar. 24, 2017

(87) PCT Pub. No.: WO2017/118060
PCT Pub. Date: Jul. 13, 2017

(65) Prior Publication Data
US 2018/0150668 A1 May 31, 2018

(30) Foreign Application Priority Data

Jan. 5, 2016 (CN) .......................... 2016 1 0006717

(51) Int. Cl.
*G06K 9/00* (2006.01)
*H01L 27/12* (2006.01)
(Continued)

(52) U.S. Cl.
CPC .......... *G06K 9/0004* (2013.01); *H01L 27/124* (2013.01); *H01L 27/127* (2013.01);
(Continued)

(58) Field of Classification Search
None
See application file for complete search history.

(56) References Cited

U.S. PATENT DOCUMENTS

2011/0186741 A1* 8/2011 Ohta .......................... G01T 1/24
250/370.08
2015/0102449 A1* 4/2015 Kudo .................. H01L 31/1055
257/459
(Continued)

FOREIGN PATENT DOCUMENTS

CN 104112120 A 10/2014
CN 104882457 A 9/2015
(Continued)

OTHER PUBLICATIONS

English translation of CN 204808361 U.*
(Continued)

*Primary Examiner* — Robert T Huber
(74) *Attorney, Agent, or Firm* — Banner & Witcoff, Ltd.

(57) ABSTRACT

A fingerprint identification device and a manufacturing method thereof, an array substrate and a display apparatus are provided. The fingerprint identification device comprises
(Continued)

first gate lines and read signal lines. The first gate lines and the read signal lines intersect with each other to define a plurality of fingerprint identification units, and each fingerprint identification unit is provided with a photosensitive element and a first transistor. The photosensitive element includes a first electrode layer, and a first doped semiconductor layer, a second doped semiconductor layer and a second electrode layer which are sequentially positioned on a surface of the first electrode layer.

12 Claims, 5 Drawing Sheets

(51) Int. Cl.
    *H01L 29/786*     (2006.01)
    *H01L 31/105*     (2006.01)
    *H01L 27/146*     (2006.01)

(52) U.S. Cl.
    CPC ...... *H01L 27/1222* (2013.01); *H01L 27/1255* (2013.01); *H01L 29/78669* (2013.01); *H01L 31/1055* (2013.01); *H01L 27/14678* (2013.01)

(56) References Cited

U.S. PATENT DOCUMENTS

| | | | |
|---|---|---|---|
| 2016/0233268 A1* | 8/2016 | Jiroku | H01L 31/022408 |
| 2017/0124370 A1* | 5/2017 | He | G06K 9/0012 |
| 2017/0140201 A1* | 5/2017 | Li | G06F 3/0414 |
| 2017/0242533 A1* | 8/2017 | Liu | G06F 3/0416 |

FOREIGN PATENT DOCUMENTS

| | | |
|---|---|---|
| CN | 105095855 A | 11/2015 |
| CN | 204808361 U | 11/2015 |
| CN | 105550662 A | 5/2016 |

OTHER PUBLICATIONS

Nov. 28, 2017—(CN) First Office Action Appn 201610006717.6 with English Tran.

Nov. 28, 2016—(WO) International Search Report and Written Opinion Appn PCT/CN2016/097811 with English Tran.

\* cited by examiner

FINGERPRINT IDENTIFICATION DEVICE AND MANUFACTURING METHOD THEREOF, ARRAY SUBSTRATE AND DISPLAY APPARATUS

The application is a U.S. National Phase Entry of International Application No. PCT/CN2016/097811 filed on Sep. 1, 2016, designating the United States of America and claiming priority to Chinese Patent Application No. 201610006717.6 filed on Jan. 5, 2016. The present application claims priority to and the benefit of the above-identified applications and the above-identified applications are incorporated by reference herein in their entirety.

TECHNICAL FIELD

Embodiments of the present disclosure relate to a fingerprint identification device and a manufacturing method thereof, an array substrate and a display apparatus.

BACKGROUND

Along with progress of the modern society, importance of personal information identification and personal information security gradually attracts attention of people. A human fingerprint has uniqueness and invariance, and thus, a fingerprint identification technology has the characteristics of high security, high reliability and simplicity and convenience for use, so that the fingerprint identification technology is widely applied to various fields of protecting personal information security, and particularly, the field of mobile terminals, e.g., a mobile phone, a notebook computer, a tablet computer, a digital camera and the like, which has more prominent requirements for information security. Currently, a fingerprint identification function is one of common functions of electronic devices, and has important significance for reinforcing security of the electronic devices, expanding the application range of the electronic devices and the like.

An optical fingerprint identification device is shown in FIG. 1; after light emitted by a light source 100 is transmitted to a finger through a prism 101, the light is reflected by the finger, reenters the prism 101 to be propagated, then reaches a focusing lens 102 and is focused by the focusing lens 102, and then reaches an image processor 103; and an image sensor, e.g., a Charge-Coupled Device (CCD) or a Complementary Metal Oxide Semiconductor (CMOS) image sensor, is arranged on the image processor 103. Light reflected by valley lines and ridge lines on the finger is different in angle and strength, and thus, after the reflected light is projected onto the image processor 103, a fingerprint image can be formed.

However, in the fingerprint identification device shown in FIG. 1, the prism 101, the focusing lens 102 and the image processor 103 need to occupy a large space; and moreover, a certain distance needs to be set between the imaging prism 101 and the focusing lens 102, and a certain distance also needs to be set between the focusing lens 102 and the image processor 103.

SUMMARY

According to embodiments of the disclosure, a fingerprint identification device is provided. The fingerprint identification device comprises first gate lines and read signal lines. The first gate lines and the read signal lines intersect with each other to define a plurality of fingerprint identification units, and each fingerprint identification unit is provided with a photosensitive element and a first transistor. The photosensitive element includes a first electrode layer, and a first doped semiconductor layer, a second doped semiconductor layer and a second electrode layer which are sequentially positioned on a surface of the first electrode layer. An electric field is formed between the first electrode layer and the second electrode layer, and a PN junction is formed between the first doped semiconductor layer and the second doped semiconductor layer. A gate electrode of the first transistor is connected with the first gate line, a first electrode of the first transistor is connected with the read signal line, and a second electrode of the first transistor is connected with the second electrode layer.

For example, the photosensitive element further includes a depletion layer positioned between the first doped semiconductor layer and the second doped semiconductor layer.

For example, the depletion layer and an active layer of the first transistor are provided in a same layer and are made of a same material.

For example, the first electrode layer and the gate electrode of the first transistor are provided in a same layer and are made of a same material.

For example, a material forming the second electrode layer includes a transparent conductive material.

For example, the fingerprint identification device further comprises an electrode signal line in parallel with the first gate line, the electrode signal line being connected with the first electrode layer and configured for providing an electric signal to the first electrode layer.

For example, a thickness of the first electrode layer is 10 nm to 100 nm.

For example, a thickness of the first doped semiconductor layer and a thickness of the second doped semiconductor layer are respectively 20 nm to 70 nm.

For example, a thickness of the depletion layer is 500 nm to 1500 nm.

For example, a thickness of the second electrode layer is 10 nm to 500 nm.

According to the embodiments of the disclosure, an array substrate is provided. The array substrate comprises the fingerprint identification device as described above.

For example, the array substrate comprises a display region, and the fingerprint identification device is arranged in the display region.

For example, the display region includes a plurality of sub pixels, and one fingerprint identification unit is arranged in each sub pixel.

For example, the display region includes a first color sub pixel, a second color sub pixel, a third color sub pixel and a white sub pixel, which constitute a pixel unit; and the first color, the second color and the third color constitute three primary colors; and the fingerprint identification unit is arranged in the white sub pixel.

For example, the array substrate comprises second gate lines and data lines which intersect with each other horizontally and longitudinally. The first gate line is in parallel with the second gate line, and the read signal line is in parallel with the data line.

For example, the array substrate further comprises a peripheral region, and the fingerprint identification device is positioned in the peripheral region.

According to the embodiments of the disclosure, a display apparatus is provided. The display apparatus comprises the array substrate.

According to the embodiments of the disclosure, a manufacturing method of a fingerprint identification device is provided. The method comprises: forming a gate electrode of a first transistor, a first gate line and a first electrode layer on a base substrate; forming a gate insulating layer of the first transistor on the base substrate, on which the gate electrode of the first transistor, the first gate line and the first electrode layer have been formed; forming a first doped semiconductor layer on the base substrate, on which the gate insulating layer has been formed; forming an active layer of the first transistor on the base substrate, on which the first doped semiconductor layer has been formed; forming a read signal line and a first electrode and a second electrode of the first transistor on the base substrate, on which the active layer of the first transistor has been formed, the first electrode of the first transistor being connected with the read signal line; forming a second doped semiconductor layer on the base substrate, on which the read signal line and the first electrode and the second electrode of the first transistor have been formed; forming a passivation layer on the base substrate, on which the first electrode and the second electrode of the first transistors have been formed, and forming a via hole at a position of the passivation layer, which corresponds to the second electrode of the first transistor; and forming a second electrode layer on the base substrate, on which the second doped semiconductor layer has been formed, the second electrode layer being connected with the second electrode of the first transistor through the via hole.

For example, a depletion layer positioned on the surface of the first doped semiconductor layer is formed at the same time of forming the active layer of the first transistor on the base substrate, on which the first doped semiconductor layer has been formed.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 3b is a schematic view of a depletion region between a first doped semiconductor layer and a second doped semiconductor layer in FIG. 3a;

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
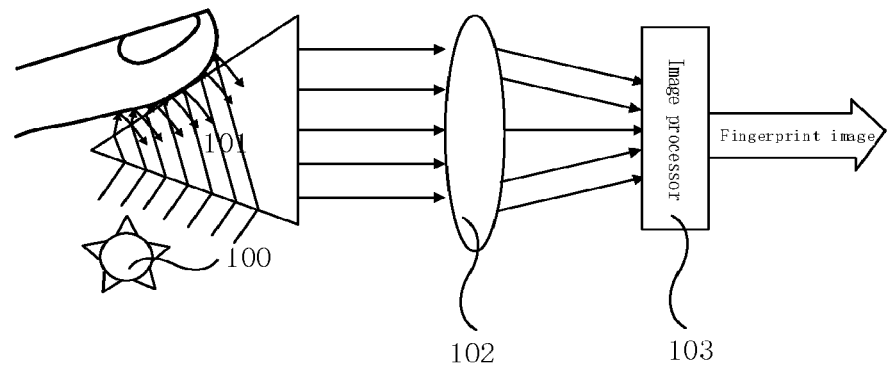
FIG. 1 is a structural schematic view of a fingerprint identification device according to one technique.
Figure 2:
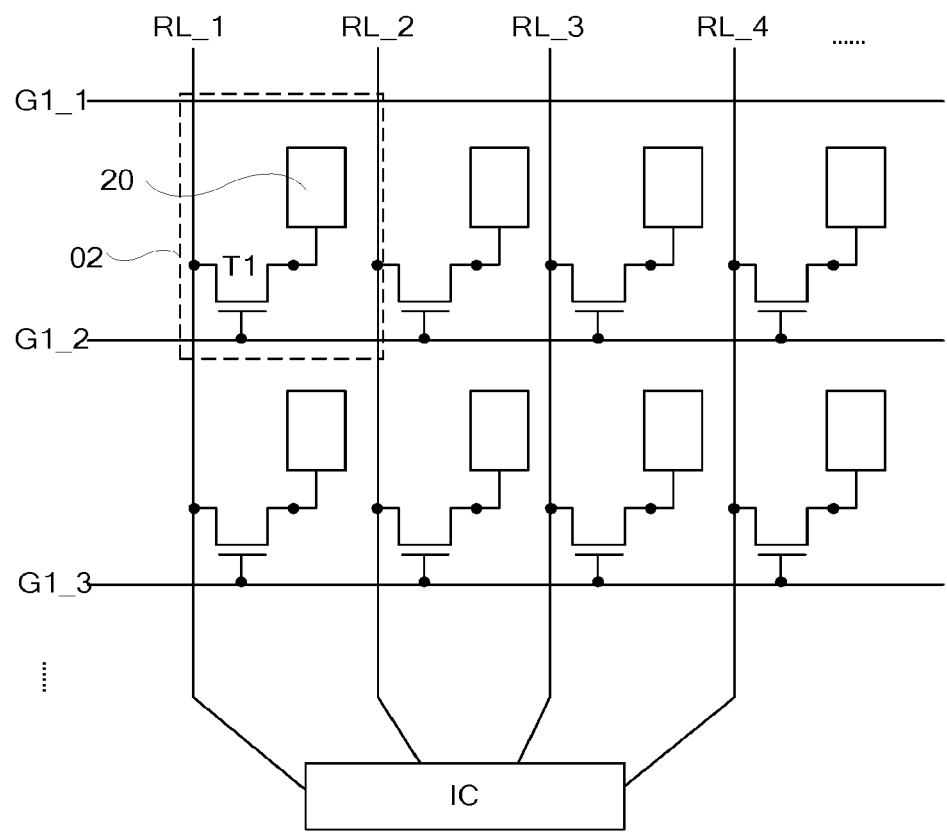
FIG. 2 is a structural schematic view of a fingerprint identification device provided by embodiments of the present disclosure.

Embodiments of the present disclosure provide a fingerprint identification device. As shown in FIG. 2, the fingerprint identification device includes first gate lines G1 and read signal lines RL. The first gate lines G1 and the read signal lines RL intersect with each other to define a plurality of fingerprint identification units 02, and each fingerprint identification unit 02 is provided with a photosensitive element 20 and a first transistor T1.

Figure 3A:
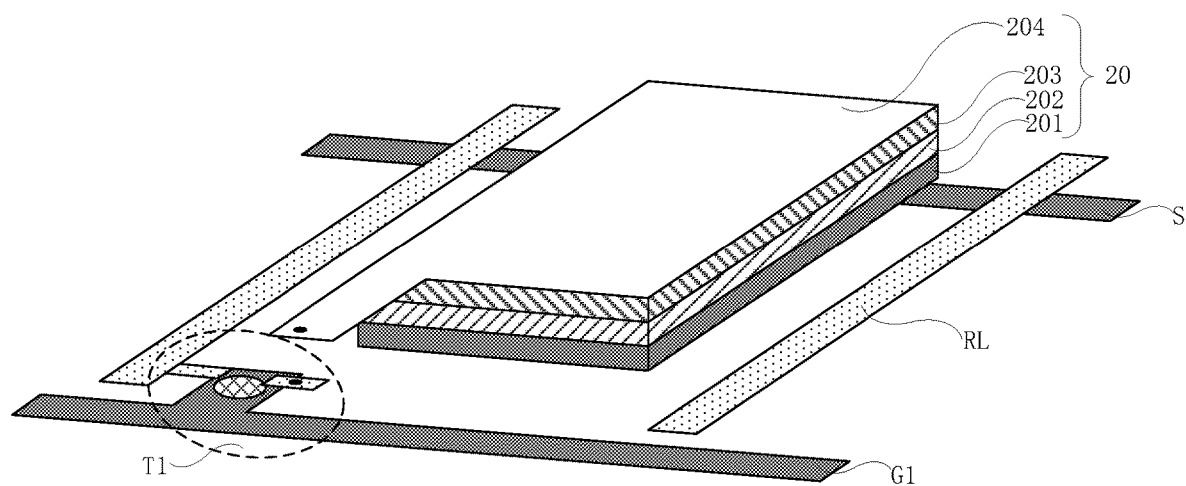
FIG. 3a is a side view of a photosensitive element in FIG. 2.

For example, the photosensitive element 20, as shown in FIG. 3a, includes a first electrode layer 201, and a first doped semiconductor layer 202, a second doped semiconductor layer 203 and a second electrode layer 204 which are sequentially positioned on a surface of the first electrode layer 201. An electric field is formed between the first electrode layer 201 and the second electrode layer 204. A PN junction is formed between the first doped semiconductor layer 202 and the second doped semiconductor layer 203.

For example, a gate electrode of the first transistor T1 is connected with the first gate line G1, a first electrode of the first transistor T1 is connected with the read signal lines RL, and a second electrode of the first transistor T1 is connected with the second electrode layer 204.

It should be noted that, the fingerprint identification device includes N first gate lines G1 (respectively G1_1, G1_2, G1_3 . . . G1_N) and M read signal lines RL (respectively RL_1, RL_2, RL_3 . . . RL_M), where N and M are positive integers greater than or equal to 1.

It should be noted that, the process of forming the electric field between the first electrode layer 201 and the second electrode layer 204 is that different potentials are applied to the first electrode layer 201 and the second electrode layer 204, and at this moment, a fixed potential V0 for example is applied to the first electrode layer 201. For example, as shown in FIG. 3a, the fingerprint identification device further includes an electrode signal line S in parallel with the first gate line G1, the electrode signal line S is connected with the first electrode layer 201 and is configured for providing an electric signal, for example, the fixed potential V0, to the first electrode layer 201.

It should be noted that, under the control of the first gate line G1, the first transistor T1 is turned on so as to connect the read signal line RL with the second electrode layer 204 by the first transistor T1, thereby providing the electric signal to the second electrode layer 204 through the read signal line RL. In this way, the electric field is formed between the first electrode layer 201 and the second electrode layer 204.

Figure 3B:
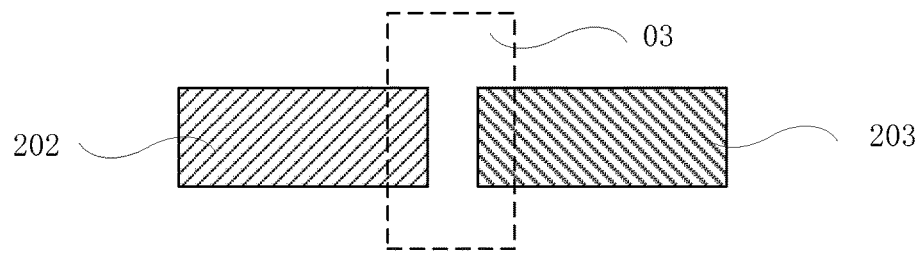

It should be noted that, formation of the PN junction between the first doped semiconductor layer 202 and the second doped semiconductor layer 203 means that an interface between the first doped semiconductor layer 202 and the second doped semiconductor layer 203 has a depletion region 03 as shown in FIG. 3b and the semiconductor PN junction is formed in the depletion region 03. In order to form the PN junction, a material forming the first doped semiconductor layer 202 for example includes a P-type semiconductor material, and a material forming the second doped semiconductor layer 203 for example includes an N-type semiconductor material. In this case, a negative voltage is applied to the first electrode layer 201, and a positive voltage is applied to the second electrode layer 204.

Or, the material forming the first doped semiconductor layer 202 includes the N-type semiconductor material, and the material forming the second doped semiconductor layer 203 includes the P-type semiconductor material. The positive voltage is applied to the first electrode layer 201, and the negative voltage is applied to the second electrode layer 204.

In order to facilitate illustration, the description below is carried out by taking the case that the first doped semiconductor layer 202 is a P-type semiconductor and the second doped semiconductor layer 203 is an N-type semiconductor as an example.

In this case, an operation principle of the photosensitive element 20 is as follows. The semiconductor PN junction is formed between the P-type first doped semiconductor layer 202 and the N-type second doped semiconductor layer 203, and at the moment, under the excitation effect of light, the photosensitive element 20 generates a great amount of hole-electron pairs in the depletion region 03. Under the action of the electric field formed between the first electrode layer 201 and the second electrode layer 204, part of the electrons move to an N-type conduction band with a lower energy level, i.e., an N-type region formed by the second doped semiconductor layer 203, and part of the holes move to a P-type valence band with a higher energy level, i.e., a P-type region formed by the first doped semiconductor layer 202. In this way, negative charges in the N-type region increase and positive charges in the P-type region increase, so that currents are generated. Skin on surface of finger of people is formed by convex ridge lines and concave valley lines, and thus, in the case that the finger press the photosensitive element 20, light reflected by the ridge lines and the valley lines is different in strength, so that different numbers of hole-electron pairs are excited in the depletion region 03 and different currents are generated. In this case, the currents generated by different fingerprint identification units 02 are read by different read signal lines RL, then the currents are processed by a chip Integrated Circuit (IC) shown in FIG. 2, and finally, it is judged whether a fingerprint at a position corresponding to each fingerprint identification unit 02 is a valley line or a ridge line, so that an integral fingerprint pattern is determined.

It should be noted that, in the case that the first doped semiconductor layer 202 is the P-type semiconductor and the second doped semiconductor layer 203 is the N-type semiconductor, trivalent impurity elements, e.g., boron ions or gallium ions, are doped in an intrinsic semiconductor, e.g., single crystal silicon, polysilicon or amorphous silicon, by an ion doping process, and then an activation treatment is carried out on the ions, so that the P-type semiconductor is formed. Similarly, by the ion doping process, pentavalent impurity elements, e.g., phosphonium ions or arsenic ions, are doped into the intrinsic semiconductor, e.g., single crystal silicon, polysilicon or amorphous silicon, so that the N-type semiconductor is formed. In order to facilitate illustration, the following embodiments are all described by taking the case of doping the boron ions into the intrinsic semiconductor to form the P-type semiconductor and doping the phosphonium ions into the intrinsic semiconductor to form the N-type semiconductor as an example.

For example, a thickness of the first doped semiconductor layer 202 and a thickness of the second doped semiconductor layer 203 are respectively 20 nm to 70 nm. In the case that the thickness of the first doped semiconductor layer 202 or the thickness of the second doped semiconductor layer 203 is less than 20 nm, the requirement for preparation accuracy is relatively high due to the excessively small thickness, so as to cause rise of production cost. Moreover, in the case that the thickness of the first doped semiconductor layer 202 or the thickness of the second doped semiconductor layer 203 is greater than 70 nm, in one aspect, it is unbeneficial to ultrathin design of the photosensitive elements 20 due to the excessively large thickness, and in another aspect, production of the relatively thick layer prolongs a duration of a production process, so as to reduce production efficiency.

According to the embodiments of the present disclosure, the fingerprint identification device includes the first gate lines and the read signal lines, the first gate lines and the read signal lines intersect with each other to define the plurality of fingerprint identification units, and each fingerprint identification unit is provided with the photosensitive element and the first transistor. The photosensitive element includes the first electrode layer, and the first doped semiconductor layer, the second doped semiconductor layer and the second electrode layer which are sequentially positioned on the surface of the first electrode layer. The electric field is formed between the first electrode layer and the second electrode layer, and the PN junction is formed between the first doped semiconductor layer and the second doped semiconductor layer. The gate electrode of the first transistor is connected with the first gate line, the first electrode of the first transistor is connected with the read signal line, and the second electrode of the first transistor is connected with the second electrode layer.

The depletion region 03 is provided at the interface of the first doped semiconductor layer and the second doped semiconductor layer, the semiconductor PN junction is formed in the depletion region, and at the moment, under the excitation effect of the light, the photosensitive element generates a great amount of hole-electron pairs in the depletion region. Under the action of the electric field formed between the first electrode layer and the second electrode layer, the holes and the electrons respectively move to the valence band with the higher energy level and the conduction band with the lower energy level so as to form the currents. At the moment, in the case that the finger of the user presses the fingerprint identification device, light reflected by the ridge lines and the valley lines on the finger is different in strength, so that the photosensitive elements are excited to generate different magnitudes of currents. The first gate lines turn on the first transistors, so that the read single lines connected with the second electrode layers of the photosensitive elements acquire the currents to identify the ridge lines and the valley lines of the finger. A prism, a CCD or a CMOS is not used in the fingerprint identification device, so that the thickness of the fingerprint identification device is reduced. Moreover, the CCD or the CMOS does not need to be arranged in the fingerprint identification device provided by the embodiments of the present disclosure, so that production cost is reduced.

Further, the depletion region 03 is positioned at the interface of the first doped semiconductor layer 202 and the second doped semiconductor layer 203, and thus, a thickness of the depletion region 03 is relatively small, so that the number of the hole-electron pairs generated by the photosensitive element 20 under the excitation effect of the light is limited and stability of the current generated by the photosensitive element 20 should be improved.

Figure 4:
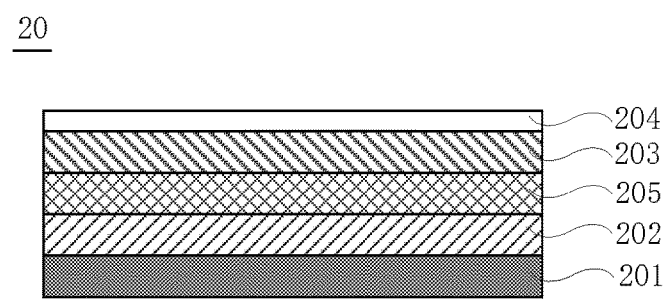
FIG. 4 is a structural schematic view of the photosensitive element in FIG. 3a having the depletion layer.

In order to solve the problem, as shown in FIG. 4, the photosensitive element 20 further for example includes a depletion layer 205 positioned between the first doped semiconductor layer 202 and the second doped semiconductor layer 203. In this way, by using the depletion layer 205, the thickness of the depletion region 03 is increased, so that the photosensitive element 20 generates a greater number of hole-electron pairs in the depletion region 03 under the excitation effect of the light to improve stability of the currents generated by the photosensitive elements 20, thereby improving a photocurrent characteristic of the photosensitive elements 20.

Figure 5:
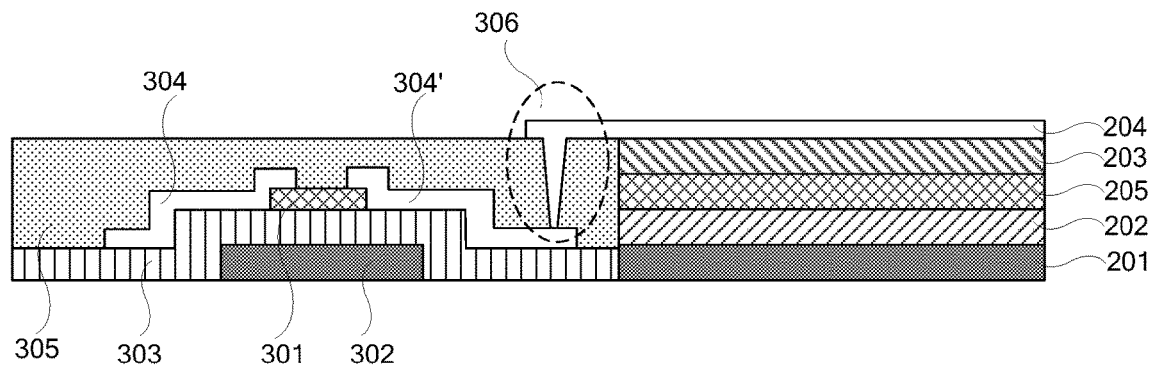
FIG. 5 is a sectional view of a first transistor and the photosensitive element in FIG. 2.

For example, a material forming the depletion layer 205 is an intrinsic semiconductor material, i.e., a non-doped pure semiconductor material, e.g., single crystal silicon, polysilicon or amorphous silicon. An active layer 301 (as shown in FIG. 5) of the first transistor T1 for example is formed by single crystal silicon, polysilicon or amorphous silicon, and thus, in order to simplify a production process, formation of the depletion layer 205 is completed upon the active layer 301 of the first transistor T1 is formed. For example, the depletion layer 205 and the active layer 301 of the first transistor T1 is provided in a same layer and is made of a same material.

It should be noted that, compared to single crystal silicon, amorphous silicon or polysilicon is more beneficial to mass production and is relatively low in cost, and thus, in the case that the fingerprint identification device is applied to a large-sized display apparatus, for example, the material forming the active layer 301 of the first transistor T1 and the depletion layer 205 is amorphous silicon (A-si) or polysilicon.

It should be noted that, in the process of preparing the first doped semiconductor layer 202, the activation treatment needs to be carried out on the doped ions, e.g., the boron ion, and a temperature of the activation treatment is about 550° C. to 650° C. The active layer 301 in the A-si Thin Film Transistor (TFT) is formed by amorphous silicon, and has a preparation temperature of about 350° C. Therefore, in the case that the active layer 301 of the first transistor T1 and the depletion layer 205 are simultaneously formed, the depletion layer 205 is formed after the first doped semiconductor layer 202, so that the active layer 301 is prepared after the first doped semiconductor layer 202 is formed, thereby avoiding damage of the high temperature of the ion activation treatment carried out in the process of preparing the first doped semiconductor layer 202 to the active layer 301 of the first transistor T1.

For example, a thickness of the depletion layer 205 is 500 nm to 1500 nm. In the case that the thickness of the depletion layer 205 is less than 500 nm, the requirement for preparation accuracy is relatively high due to the excessively small thickness, so as to cause rise of production cost. Moreover, in the case that the thickness of the depletion layer 205 is greater than 1500 nm, in one aspect, it is unbeneficial to ultrathin design of the photosensitive element 20 due to the excessively large thickness, and in another aspect, production of the relatively thick layer prolongs the duration of the production process, so as to reduce production efficiency.

In order to simplify the preparation process, preparation of the photosensitive element 20 for example is completed in the process of preparing the first transistor T1. For example, the first electrode layer 201 and the gate electrode 302 (as shown in FIG. 5) of the first transistor T1 are provided in a same layer and are made of a same material. For example, metal molybdenum, or molybdenum titanium alloy and the like are adopted. In this way, the first electrode layer 201 and the gate electrode 302 are simultaneously formed by a single patterning process.

For example, a thickness of the first electrode layer 201 is 10 nm to 100 nm. In the case that the thickness of the first electrode layer 201 is less than 10 nm, the requirement for preparation accuracy is relatively high due to the excessively small thickness, so as to cause rise of production cost. Moreover, in the case that the thickness of the first electrode layer 201 is greater than 100 nm, in one aspect, it is unbeneficial to ultrathin design of the photosensitive element 20 due to the excessively large thickness, and in another aspect, production of the relatively thick layer prolongs the duration of the production process, so as to reduce production efficiency.

It should be noted that, the patterning process in the embodiments of the present disclosure for example includes a photolithography process, or includes the photolithography process and an etching step, or includes other processes for forming a predetermined pattern, e.g., printing, ink jetting and the like; and the photolithography process means a process which forms the pattern by film formation, exposure, development and the like and with utilizing photoresist, a mask, an exposure machine and the like. The patterning process can be selected according to the specific structure formed in the embodiments of the present disclosure.

The single patterning process in the embodiments of the present disclosure means that different exposure regions by one mask exposure process with using one mask, and then removing processes of etching, ashing and the like are carried on the different exposure regions to finally obtain the desired pattern.

Moreover, in order to improve an output rate of the light reflected by the finger and enable more light to enter the photosensitive element 20 so as to excite holes-electrons, for example, a material forming the second electrode layer 204 is a transparent conductive material, e.g., indium tin oxide, indium zinc oxide, zinc oxide, polyethylene dioxythiophene, carbon nano tube, silver nanowire, graphene and the like.

For example, a thickness of the second electrode layer 204 is 10 nm to 500 nm. In the case that the thickness of the second electrode layer 204 is less than 10 nm, the requirement for preparation accuracy is relatively high due to the excessively small thickness, so as to cause rise of production cost. Moreover, in the case that the thickness of the second electrode layer 204 is greater than 500 nm, in one aspect, it is unbeneficial to ultrathin design of the photosensitive element 20 due to the excessively large thickness, and in another aspect, production of the relatively thick layer prolongs the duration of the production process, so as to reduce production efficiency.

The embodiments of the present disclosure provide an array substrate which includes any fingerprint identification device as mentioned above and has the same structure and advantageous effects with the fingerprint identification device provided by the above-mentioned embodiments. The structure and the advantageous effects of the fingerprint identification device have been described in detail in the above-mentioned embodiments, and thus are not repeated herein.

Figure 6:
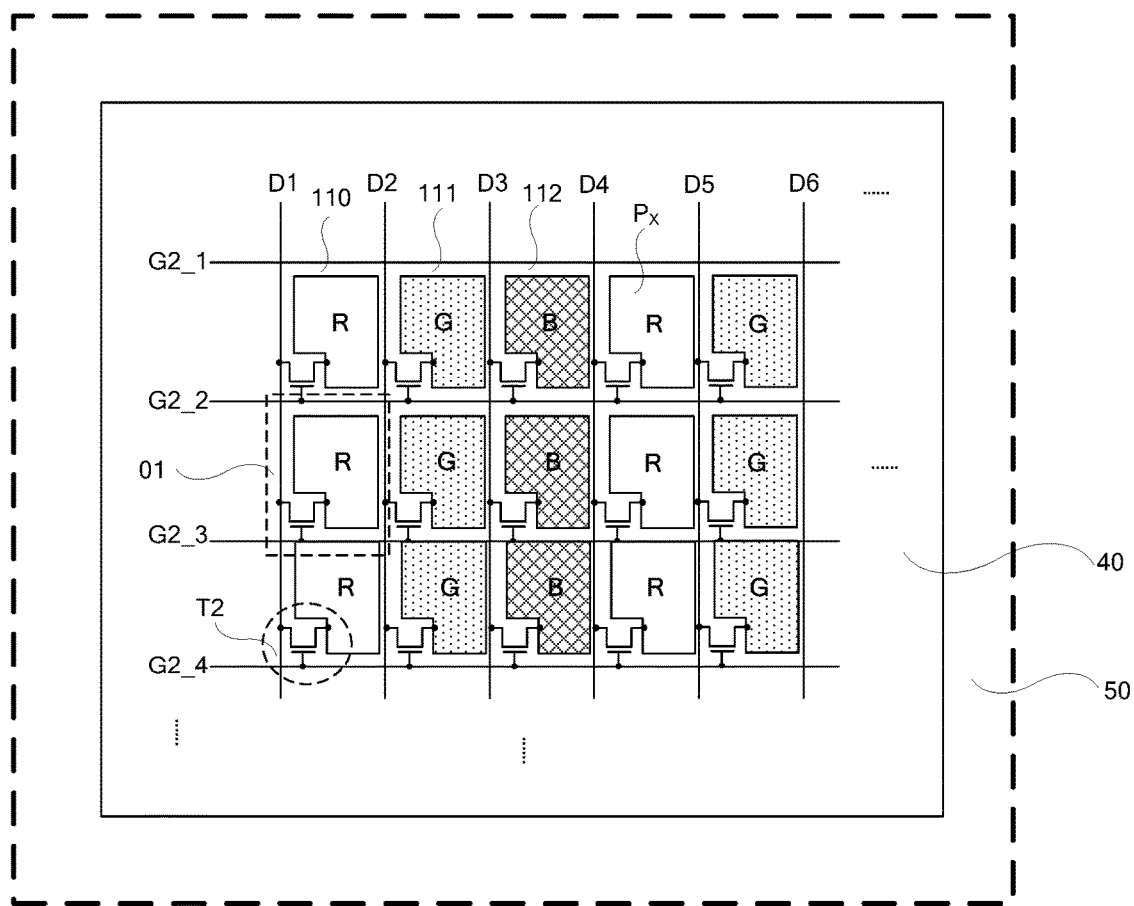
FIG. 6 is a schematic view of an array substrate provided by the embodiments of the present disclosure.

For example, the array substrate, as shown in FIG. 6, includes a display region 40 and a peripheral region 50 positioned around the display region.

For example, a plurality of second gate lines G2 (G2_1, G2_2, G2_3 . . . ) and a plurality of data lines D (D_1, D_2, D_3 . . . ), which intersect with each other horizontally and longitudinally, are arranged in the display region 40.

Moreover, the display region 40 further includes a plurality of sub pixels 01, and the sub pixels 01 are defined by the second gate lines G2 and the data lines D intersecting with each other. Each sub pixel 01 is provided with a second transistor T2, a gate electrode of the second transistor T2 is connected with the second gate line G2, a first electrode of the second transistor T2 is connected with the data line D, and a second electrode of the second transistor T2 is connected with a pixel electrode Px in the sub pixel 01. The second transistor T2 is controlled to be turned on by the second gate line G2, so as to transmit a data voltage transmitted by the data line D to the pixel electrode Px by the second transistor T2 to charge the pixel electrode Px.

Moreover, the plurality of sub pixels for example includes a first color sub pixel 110, a second color sub pixel 111 or a third color sub pixel 112 which emit monochromatic light of three primary colors. For example, the first color sub pixel 110 is a red (R) sub pixel emitting red light, the second color sub pixel 111 is a green (G) sub pixel emitting green light, and the third color sub pixel 112 is a blue (B) sub pixel emitting blue light. The first color sub pixel 110, the second color sub pixel 111 and the third color sub pixel 112 for example constitute one pixel unit. Moreover, the color of the first color sub pixel 110, the color of the second color sub pixel 111 and the color of the third color sub pixel 112 are not limited in the embodiments of the present disclosure, and for example, light emitting by the first color sub pixel 110, light emitting by the second color sub pixel 111 and light emitting by the third color sub pixel 112 are cyan light, magenta light and yellow light.

The array substrate provided with the fingerprint identification device will be illustrated in detail by specific examples as follows.

EXAMPLE 1

In the example 1, the fingerprint identification device is arranged in the display region 40 of the array substrate.

Figure 7:
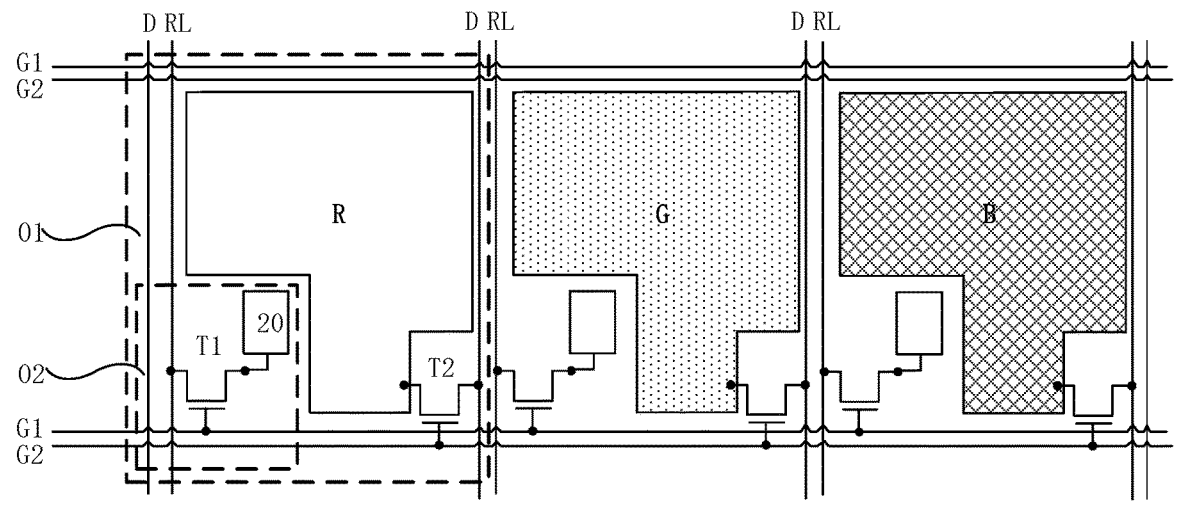
FIG. 7 is a structural schematic view of arranging fingerprint identification units shown in FIG. 2 in a display region shown in FIG. 6.

For example, one fingerprint identification unit 02 as shown in FIG. 2 is arranged in each sub pixel 01 as shown in FIG. 6. Particularly, as shown in FIG. 7, one first transistor T1 and one photosensitive element 20 in the fingerprint identification unit 02 are arranged in each sub pixel 01.

In this way, fingerprint identification is implemented in the display region 40.

Moreover, the second gate line G2 and the data line D intersect with each other to define the sub pixel 01, and the first gate line G1 and the read signal line RL define the fingerprint identification unit 02. Therefore, in order to make a wiring structure on the entire array substrate neat, for example, the first gate line G1 is in parallel with the second gate line G2, and the read signal line RL is in parallel with the data line D.

EXAMPLE 2

In the example, the fingerprint identification device is also arranged in the display region 40, but a difference from the example 1 is that in the example 2, it is not each sub pixel 01 is provided with the fingerprint identification unit 02.

For example, the fingerprint identification unit 02 is arranged in one of the sub pixels constituting one pixel unit. For example, in the case that the sub pixels constituting one pixel unit are the first color sub pixel 110, the second color sub pixel 111 and the third color sub pixel 112, the fingerprint identification unit 02 is arranged in one of the first color sub pixel 110, the second color sub pixel 111 and the third color sub pixel 112. For example, the first color, the second color and the third color constitute three primary colors.

Figure 8:
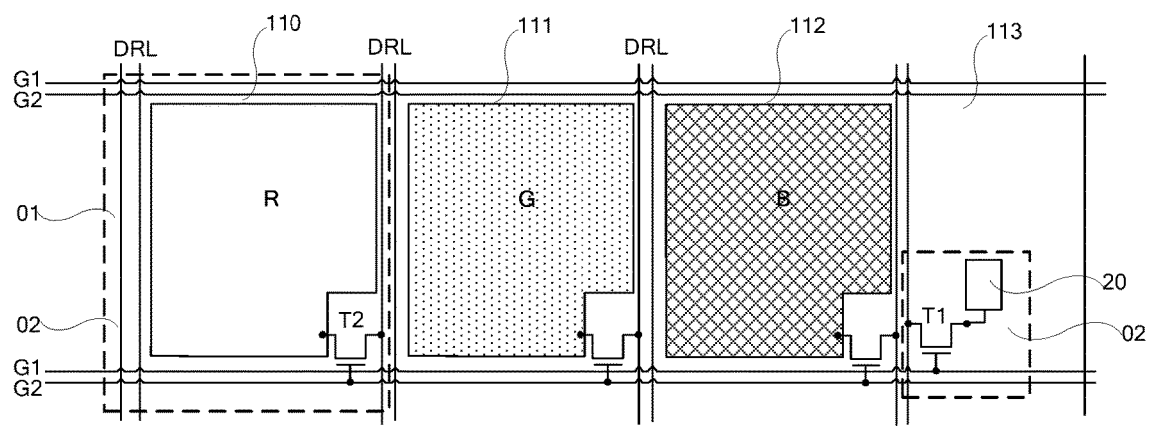
FIG. 8 is another structural schematic view of arranging the fingerprint identification units shown in FIG. 2 in the display region shown in FIG. 6.

For example, as shown in FIG. 8, the pixel unit in the display region includes the first color sub pixel 110, the second color sub pixel 111, the third color sub pixel 112 and a white sub pixel 113; and in this case, for example, the fingerprint identification unit 02 is arranged in the white sub pixel 113.

For example, the white sub pixel 113 is configured for transmitting a white light provided by a backlight. In addition, for a display apparatus capable of transmitting the light of the backlight without applying a voltage to the liquid crystals, the pixel electrode and the second transistor T2 connected with the pixel electrode do not need to be provided in the white sub pixel 113. In this case, as shown in FIG. 8, only the first transistor T1 and the photosensitive element 20 are arranged in the white sub pixel 113.

From the above, in both the example 1 and the example 2, the fingerprint identification device is arranged in the display region. In this case, for example, some instructions displayed in the display region 40 are triggered after the fingerprint identification is completed. For example, in the case that an OK button needs to be pressed for bank transaction information, the fingerprint is identified upon the user presses the virtual OK button displayed on the screen, so that operation security of the mobile terminal is improved.

Compared to the example 1, the example 2 only needs to arrange the fingerprint identification unit 02 in a certain sub pixel such as the white sub pixel 113, and thus, aperture ratios of other sub pixels, e.g., the first color sub pixel 110, the second color sub pixel 111 and the third color sub pixel 112, are not influenced. Compared to the example 2, due to arrangement of the fingerprint identification unit 02 in each sub pixel, the example 1 has high fingerprint acquisition accuracy.

In addition, the fingerprint identification device for example is arranged in the peripheral region 50 as shown in FIG. 6 so as not to cause influence on an aperture ratio and a display effect of the display region 40. For example, the peripheral region 50 is configured for arranging driving circuits, e.g., driving circuits and components such as a gate driving circuit for scanning the first gate line G1 and the second gate line G2 line by line, a source driving circuit for outputting a data signal to the data line D, a driving IC connected with the read signal line RL as shown in FIG. 2 and the like.

The embodiments of the present disclosure provide a display apparatus which includes any one array substrate as mentioned above. The display apparatus has the same structure and advantageous effects with the array substrate provided by the above-mentioned embodiments. The structure and the advantageous effects of the array substrate have been described in detail in the above-mentioned embodiment, and thus are not repeated herein.

Figure 9:
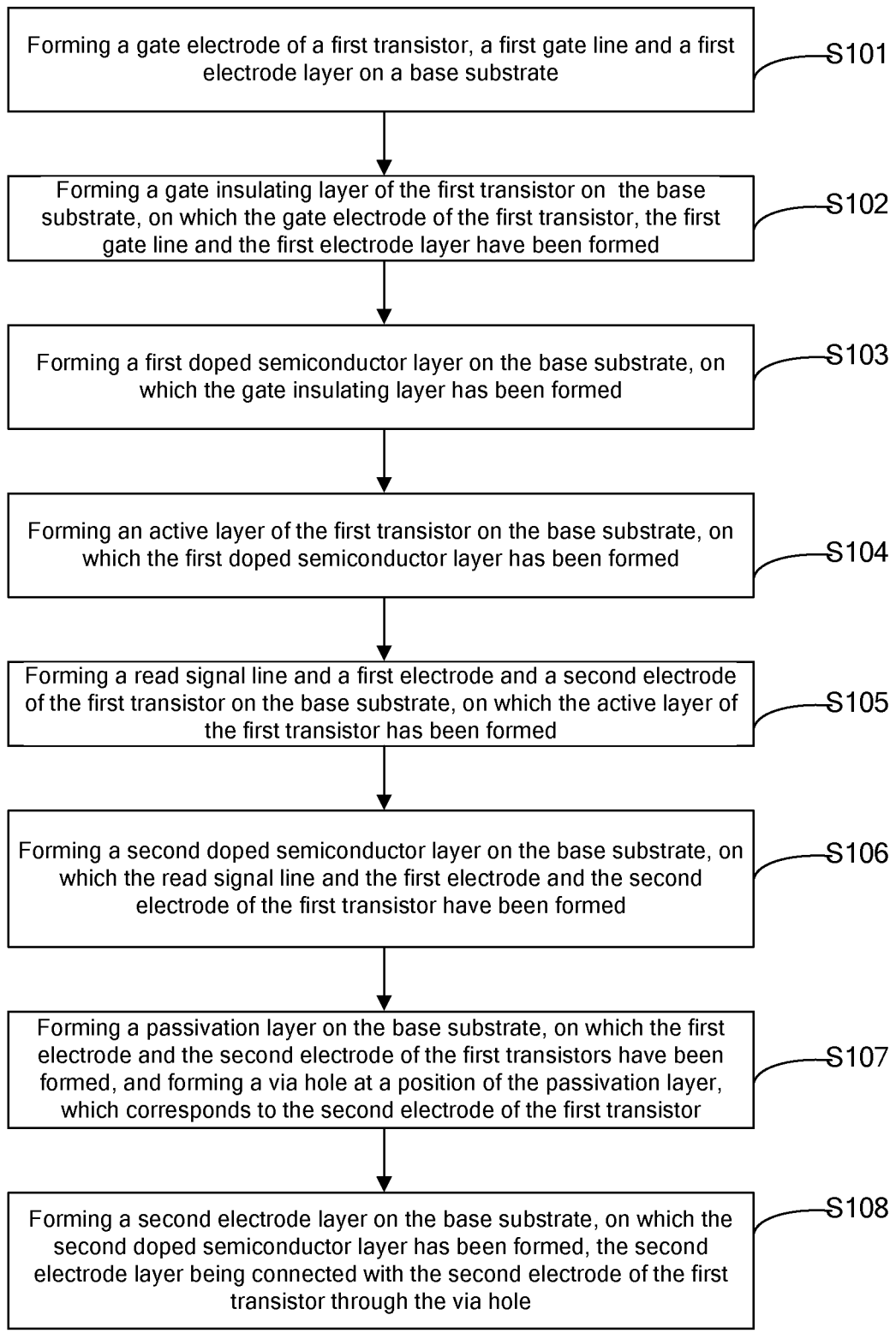
FIG. 9 is a flow chart of a manufacturing method of a fingerprint identification device, which is provided by the embodiments of the present disclosure.

The embodiments of the present disclosure provide a manufacturing method of a fingerprint identification device. As shown in FIG. 9, the method includes:

S101: forming a gate electrode 302 of a first transistor T1 as shown in FIG. 5, a first gate line G1 and a first electrode layer 201 on a base substrate as shown in FIG. 3a.

For example, the base substrate is a transparent glass substrate or a resin substrate. A gate metal layer is coated on the base substrate and then patterns of the gate electrode 302, the first gate line G1 and the first electrode layer 201 are formed by a single patterning process.

Moreover, in the case that the fingerprint identification device includes an electrode signal line S as shown in FIG. 3a, the electrode signal line S is simultaneously formed in t the step S101.

For example, a thickness of the first electrode layer 201 is 10 nm to 100 nm.

S102: forming a gate insulating layer 303 of the first transistor T1 on the base substrate, on which the gate electrode 302 of the first transistor T1, the first gate line G1 and the first electrode layer 201 have been formed.

S103: forming a first doped semiconductor layer 202 on the base substrate, on which the gate insulating layer 303 has been formed. For example, a thickness of the first doped semiconductor layer 202 is 20 nm to 70 nm.

For example, a semiconductor layer such as an A-si layer is coated on the base substrate on which the gate insulating layer 303 has been formed, and then a pattern of an undoped semiconductor layer is formed by a single patterning process. Next, by an ion doping process, boron ion doping is carried out on the patterned semiconductor layer. The boron ion is a trivalent ion and, the boron ion takes away one electron of the silicon atom and the silicon atom has one more hole in the case that the boron ion and the silicon atom form a covalent bond, so that the doped A-si semiconductor layer becomes a P-type semiconductor layer. Next, the activation treatment is carried out on the doping ions, e.g., the boron ions. For example, a temperature of the activation treatment is between 550° C. and 650° C.

S104: forming an active layer 301 of the first transistor T1 on the base substrate, on which the first doped semiconductor layer 202 has been formed.

For example, an A-si layer is be formed on the base substrate on which the first doped semiconductor layer 202 has been formed, and then a pattern of the active layer 301 is formed by a single patterning process. The active layer 301 of the TFT is formed after the step of forming the first doped semiconductor layer 202, and thus, the high temperature required upon the ions are activated in the step S103 do not influence the active layer 301 of the first transistor T1.

S105: forming a read signal line RL and a first electrode 304 and a second electrode 304' of the first transistor T1 on the base substrate, on which the active layer 301 of the first transistor T1 has been formed. For example, as shown in FIG. 3*a*, the first electrode 304 of the first transistor T1 is connected with the read signal line RL.

For example, a source-drain metal layer is formed on the base substrate on which the active layer 301 has been formed, and then patterns of the read signal line RL and the first electrode 304 and the second electrode 304' of the first transistor T1 are formed by a single patterning process.

It should be noted that, in the embodiments of the present disclosure, the first electrode of the transistor is a source electrode and the second electrode is a drain electrode; or, the first electrode is the drain electrode and the second electrode is the source electrode. The embodiments of the present disclosure are not limited thereto.

S106: forming a second doped semiconductor layer 203 on the base substrate, on which the read signal line RL and the first electrode 304 and the second electrode 304' of the first transistor T1 have been formed. For example, a thickness of the second doped semiconductor layer 203 is 20 nm to 70 nm.

For example, a semiconductor layer such as an A-si layer is formed on the base substrate, on which the read signal line RL and the first electrode 304 and the second electrode 304' of the first transistor T1 have been formed, and then a pattern of an undoped semiconductor layer is formed by a single patterning process. Next, by the ion doping process, phosphorus ion doping is carried out on the patterned semiconductor layer. The phosphorus ion is a pentavalent ion, and thus, the silicon atom has one more electron in the case that the phosphorus ion and the silicon atom form a covalent bond, so that the doped A-si semiconductor layer becomes an N-type semiconductor layer.

S107: forming a passivation layer 305 on the base substrate, on which the first electrode 304 and the second electrode 304' of the first transistor T1 have been formed, and forming a via hole 306 at a position of the passivation layer 305, which corresponds to the second electrode 304' of the first transistor T1.

For example, a pattern of the passivation layer 305 and the via hole 306 are formed by the patterning process.

For example, the step may be carried out after the step S106, or may be carried out after the step S105 and before the step S106.

S108: forming a second electrode layer 204 on the base substrate, on which the second doped semiconductor layer 203 has been formed, the second electrode layer 204 being connected with the second electrode 304' of the first transistor T1 through the via hole 306. For example, a thickness of the second electrode layer 204 is 10 nm to 500 nm.

For example, a pattern of the second electrode layer 204 is formed on the base substrate on which the second doped semiconductor layer 203 has been formed by a single patterning process.

A depletion region is provided at an interface of the first doped semiconductor layer and the second doped semiconductor layer, a semiconductor PN junction is formed in the depletion region, and at the moment, under the excitation effect of light, the photosensitive element generates a great amount of hole-electron pairs in the depletion region. Under the action of the electric field formed between the first electrode layer and the second electrode layer, the holes and the electrons respectively move to the valence band with the higher energy level and the conduction band with the lower energy level so as to form the currents. At the moment, in the case that the finger of the user presses the fingerprint identification device, light reflected by the ridge lines and the valley lines on the finger is different in strength, so that the photosensitive elements are excited to generate different magnitudes of currents. The first gate lines turn on the first transistors, so that the read single lines connected with the second electrode layers of the photosensitive elements acquire the currents to identify the ridge lines and the valley lines of the finger. A prism, a CCD or a CMOS is not used in the fingerprint identification device, so that the thickness of the fingerprint identification device is reduced.

Further, the depletion region 03 is positioned at the interface of the first doped semiconductor layer 202 and the second doped semiconductor layer 203, and thus, a thickness of the depletion region 03 is relatively small, so that the number of the hole-electron pairs generated by the photosensitive element 20 under the excitation effect of the light is limited and stability of the current generated by the photosensitive element 20 should be improved.

In order to solve the problem, as shown in FIG. 4, the photosensitive element 20 further includes a depletion layer 205 positioned between the first doped semiconductor layer 202 and the second doped semiconductor layer 203. In this way, by the depletion layer 205, the thicknesses of the depletion region 03 is increased, so that the photosensitive element 20 generates a greater number of hole-electron pairs in the depletion region 03 under the excitation effect of the light to improve stability of the current generated by the photosensitive element 20, thereby improving the photocurrent characteristic of the photosensitive element 20.

For example, during the step S104 is carried out, the depletion layer 205 positioned on the surface of the first doped semiconductor layer 202 is formed. For example, a thickness of the depletion layer 205 is 500 nm to 1500 nm.

The foregoing embodiments merely are specific embodiments of the disclosure and not intended to define the scope of the disclosure, and any variations or replacements which can be easily thought of by those skilled in the art in the technical scope of the disclosure shall fall within the scope of disclosure. Therefore, the scope of the disclosure shall be determined by the scope of the appended claims.

The present application claims priority of the Chinese Patent Application No. 201610006717.6 filed on Jan. 5, 2016, the disclosure of which are incorporated herein by its reference in its entirety as part of the present application.

The invention claimed is:

1. An array substrate, comprising a fingerprint identification device, wherein
the fingerprint identification device comprises first gate lines and read signal lines;
the first gate lines and the read signal lines intersect with each other to define a plurality of fingerprint identification units, and each fingerprint identification unit is provided with a photosensitive element and a first transistor;
the photosensitive element includes a first electrode layer, and a first doped semiconductor layer, a second doped semiconductor layer, and a second electrode layer which are sequentially positioned on a surface of the first electrode layer;
the photosensitive element is configured to form an electric field between the first electrode layer and the second electrode layer;
a gate electrode of the first transistor is connected with one of the first gate lines, a first electrode of the first transistor is connected with one of the read signal lines, and a second electrode of the first transistor is directly connected with the second electrode layer;
the array substrate comprises a display region, and the fingerprint identification device is arranged in the display region;
the display region includes a first color sub pixel, a second color sub pixel, a third color sub pixel, and a white sub pixel, which constitute a pixel unit; a color of the first color sub pixel, a color of the second color sub pixel, and a color of the third color sub pixel constitute three primary colors; and
the fingerprint identification unit is arranged in the white sub pixel.

2. The array substrate according to claim 1, wherein the fingerprint identification device further comprises electrode signal lines, wherein
a length direction of each of the electrode signal lines is parallel with a length direction of each of the first gate lines, and one of the electrode signal lines is connected with the first electrode layer and configured for providing an electric signal to the first electrode layer.

3. The array substrate according to claim 1, wherein the first electrode layer and the gate electrode of the first transistor are provided in a same layer, are made of a same material, and have a same thickness.

4. The array substrate according to claim 1, wherein a material forming the second electrode layer includes a transparent conductive material.

5. The array substrate according to claim 1, wherein a thickness of the first electrode layer is 10 nm to 100 nm.

6. The array substrate according to claim 1, wherein a thickness of the first doped semiconductor layer and a thickness of the second doped semiconductor layer are respectively 20 nm to 70 nm.

7. The array substrate according to claim 1, wherein a thickness of the second electrode layer is 10 nm to 500 nm.

8. The array substrate according to claim 1, wherein only one fingerprint identification unit is arranged in the white sub pixel.

9. The array substrate according to claim 1, further comprising second gate lines and data lines which intersect with each other to define a plurality of sub pixels, wherein
each of the sub pixels is provided with a second transistor and a pixel electrode, a gate electrode of the second transistor is connected with one of the second gate lines, a first electrode of the second transistor is connected with one of the data lines, and a second electrode of the second transistor is connected with the pixel electrode; and
the first gate lines are parallel with the second gate lines, and the read signal lines are parallel with the data lines.

10. The array substrate according to claim 1, further comprising a peripheral region surrounding the display region.

11. A display apparatus, comprising the array substrate according to claim 1.

12. The array substrate according to claim 1, wherein the first doped semiconductor layer and the second doped semiconductor layer directly contact with each other and a PN junction is between the first doped semiconductor layer and the second doped semiconductor layer.

* * * * *